(12) United States Patent
Chindalore

(10) Patent No.: US 7,157,345 B1
(45) Date of Patent: Jan. 2, 2007

(54) SOURCE SIDE INJECTION STORAGE DEVICE AND METHOD THEREFOR

(75) Inventor: Gowrishankar Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/170,444

(22) Filed: Jun. 29, 2005

(51) Int. Cl.
H01L 21/331 (2006.01)

(52) U.S. Cl. ............................. 438/364; 257/E21.444; 438/180; 977/943

(58) Field of Classification Search ................ 438/593, 438/595, 257, 962, FOR. 212, 180, 197, 438/364; 257/E21.444; 977/943
See application file for complete search history.

(56) References Cited

U.S. PATENT DOCUMENTS

| | | | |
|---|---|---|---|
| 6,133,098 A | 10/2000 | Ogura et al. | |
| 6,373,096 B1 * | 4/2002 | Hisamune et al. | 257/316 |
| 6,687,156 B1 * | 2/2004 | Kobayashi et al. | 365/185.05 |
| 6,992,349 B1 * | 1/2006 | Lee et al. | 257/324 |
| 2002/0028541 A1 * | 3/2002 | Lee et al. | 438/149 |
| 2003/0080372 A1 * | 5/2003 | Mikolajick | 257/315 |
| 2005/0218522 A1 * | 10/2005 | Nomoto et al. | 257/758 |
| 2005/0243603 A1 * | 11/2005 | Kobayashi et al. | 365/185.17 |
| 2006/0018164 A1 * | 1/2006 | Wu | 365/185.29 |
| 2006/0076586 A1 * | 4/2006 | Swift et al. | 257/288 |
| 2006/0076606 A1 * | 4/2006 | Lojek | 257/315 |
| 2006/0076609 A1 * | 4/2006 | Chindalore et al. | 257/316 |
| 2006/0079051 A1 * | 4/2006 | Chindalore et al. | 438/257 |
| 2006/0079455 A1 * | 4/2006 | Gazit et al. | 514/12 |
| 2006/0086970 A1 * | 4/2006 | Kim | 257/321 |

* cited by examiner

Primary Examiner—Michelle Estrada
Assistant Examiner—Jarrett Stark
(74) Attorney, Agent, or Firm—James L. Clingan, Jr.; Robert L. King

(57) ABSTRACT

A memory charge storage device has regions of sacrificial material overlying a substrate (12). For each memory cell a first doped region (20) and a second doped region (24) are formed within the substrate and on opposite sides of one (16) of the regions of sacrificial material. A discrete charge storage layer (28) overlies the substrate and is between the regions of sacrificial material. In one form a control electrode (34) is formed per memory cell overlying the substrate with an underlying substrate diffusion and laterally adjacent one of the regions of sacrificial material. A third substrate diffusion (60) is positioned between the two control electrodes. In another form two control electrodes are formed per memory cell with a substrate diffusion underlying each control electrode. In both forms a select electrode (64) overlies and is between both of the two control electrodes.

11 Claims, 5 Drawing Sheets

SOURCE SIDE INJECTION STORAGE DEVICE AND METHOD THEREFOR

RELATED APPLICATIONS

This application is related to the following patent applications:

U.S. Patent application Ser. No. 11/170,446 titled, "Source Side Injection Storage Device with Control Gates Adjacent to Shared Source/Drain and Method Therefor," by Hong et al., filed concurrently herewith, and assigned to the assignee hereof; and U.S. Patent application Ser. No. 11/170,447 titled, "Source Side Injection Storage Device with Spacer Gates and Method Therefor," by Hong et al., filed concurrently herewith, and assigned to the assignee hereof.

FIELD OF THE INVENTION

This invention relates to non-volatile memories, and more particularly to storage devices in the non-volatile memories that use source side injection.

BACKGROUND OF THE INVENTION

Source side injection (SSI) has been found to have benefits over regular hot carrier injection (HCI) used in the programming of non-volatile memories (NVMs). Programming by SSI is able to be performed at significantly lower power than programming by regular (HCI). This is particularly important in uses such as cell phones in which battery operation is very important. One of the disadvantages of SSI is that the storage devices require more area on the integrated circuit which increases cost. The design of the individual memory cells for SSI generally includes a transition in the gate structure over the channel which requires more area.

One of the techniques in the attempt to reduce the impact of the increased storage-device size has been the use of a virtual ground array (VGA) architecture. VGA has been known to require relatively small area compared to other architectures while increasing other difficulties such as read disturb. This has nonetheless been a popular architecture for low cost NVMs. Further reductions in space in the storage cell would further reduce size and thus cost.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a storage device has a control gate that is shared by two memory cells and the drain for both memory cells is a first doped region directly under the control gate. The control gate, in the channel direction, completely covers this doped region. The source, in a second doped region, for a given memory cell is disposed away from the shared control gate of the given memory cell. The second doped region is shared by an adjacent memory cell that has a different control gate. This structure provides for reduced area while retaining the ability to perform programming by SSI. This is better understood by reference to the drawings and the following description.

Figure 1:
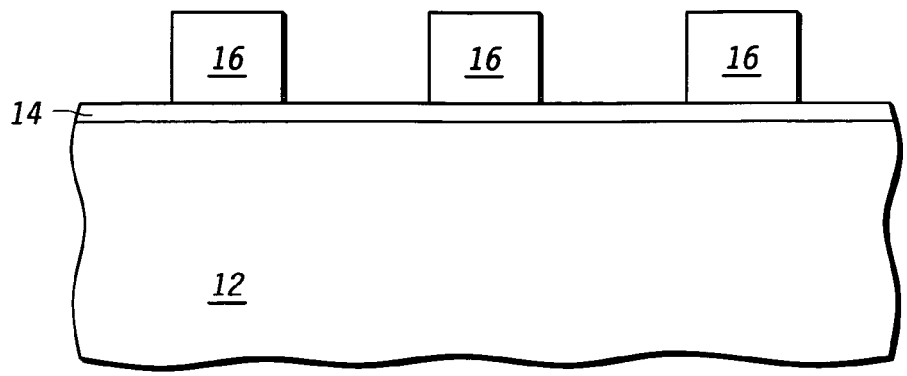
FIG. 1 is a cross section of a storage device structure at a stage in processing according to one embodiment.

Shown in FIG. 1 is a storage device structure 10 comprising a semiconductor substrate 12, a silicon oxide layer 14 on substrate 12, and a plurality of patterned silicon nitride layers 16 on silicon oxide layer 14. Silicon oxide layer 14 is preferably 50–100 Angstroms thick. Patterned nitride layers 16 are preferably about 1000 Angstroms thick, about 1500 Angstroms wide, and about 1500 Angstroms apart. These layers may run for a comparatively long length, for example the length of a memory array. Semiconductor substrate 12 is preferably silicon but could be another semiconductor material.

Figure 2:
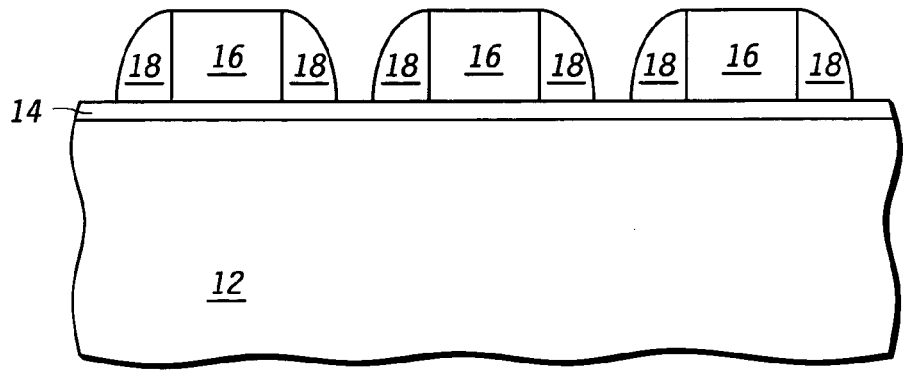
FIG. 2 is a cross section of the storage device structure of FIG. 1 at a subsequent stage in processing.

Shown in FIG. 2 is storage device structure 10 after formation of sidewall spacers 18 around patterned nitride layers 16.

Figure 3:
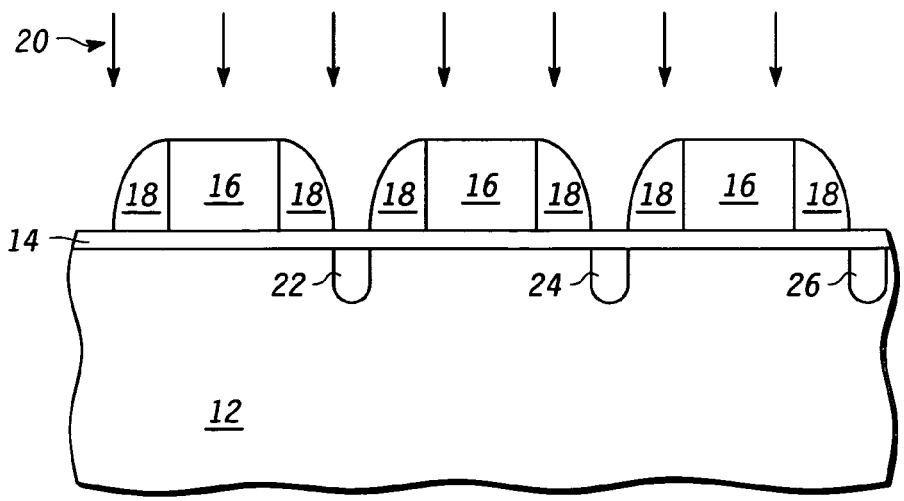
FIG. 3 is a cross section of the storage device structure of FIG. 2 at a subsequent stage in processing.

Shown in FIG. 3 is storage device structure 10 after an implant 20 to form doped regions 22, 24, and 26 between patterned nitride layers 16 as masked by sidewall spacers 18. Doped regions 22, 24, and 26 are preferably doped to N type to a depth for use as a source/drain. The N-type doping can be achieved using phosphorus or arsenic. For P channel operation, doped regions 22, 24, and 26 can be doped to P type instead of N type.

Figure 4:
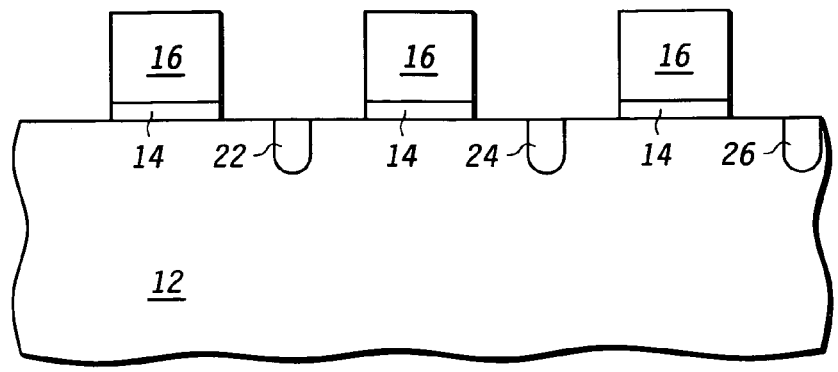
FIG. 4 is a cross section of a storage device structure of FIG. 3 at a subsequent stage.

Shown in FIG. 4 is storage device structure 10 after removal sidewall spacers 18 and the portion of oxide layer 14 between the nitride layers. This can be achieved with a wet HF etch which is highly selective between nitride and oxide.

Figure 5:
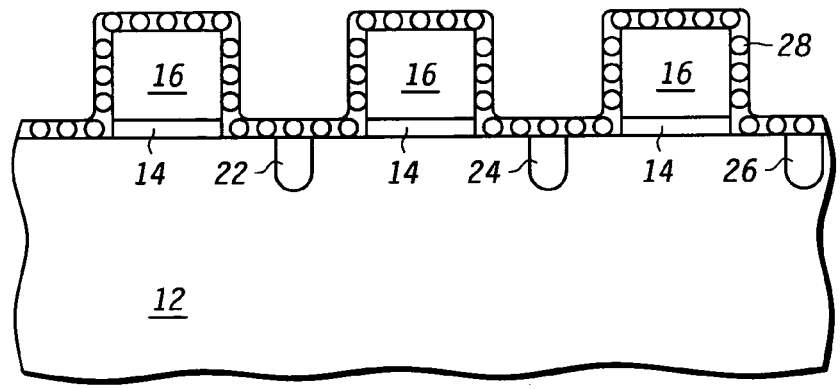
FIG. 5 is a cross section of the storage device structure of FIG. 4 at a subsequent stage in processing.

Shown in FIG. 5 is storage device structure 10 after forming a layer of a storage layer 28 which in this example comprises a nanocrystals in a dielectric.

Figure 6:
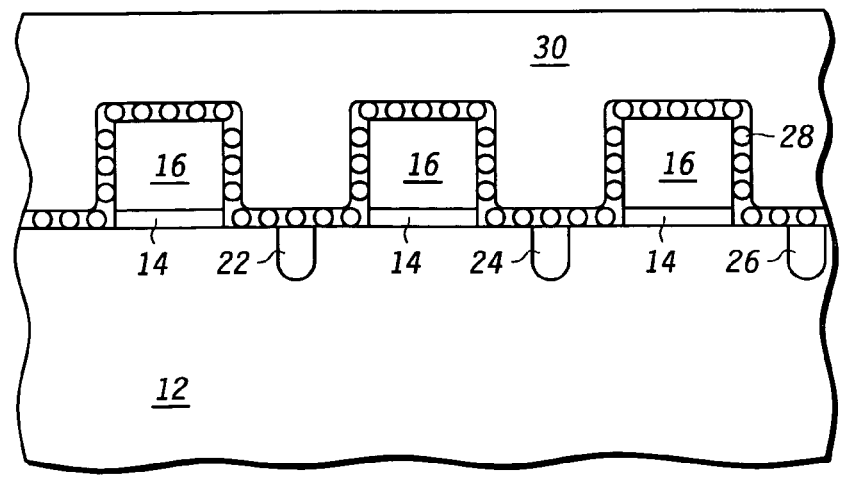
FIG. 6 is a cross section of the storage device structure of FIG. 5 at a subsequent stage in processing.

Shown in FIG. 6 is storage device structure 10 after formation of a gate layer 30. This is shown as a planar layer but it may also be formed as a conformal layer. Gate layer 30 may also be a stack of different conductive layers. Gate layer 30 is preferably a metal that is deposited by plating but could be another material and could be deposited by another method for depositing a layer that can be useful as a gate. In the case of plating, a seed layer (not separately shown) would be formed before the plating of ultimate gate layer 30. In this example the metal is preferably tungsten.

Figure 7:
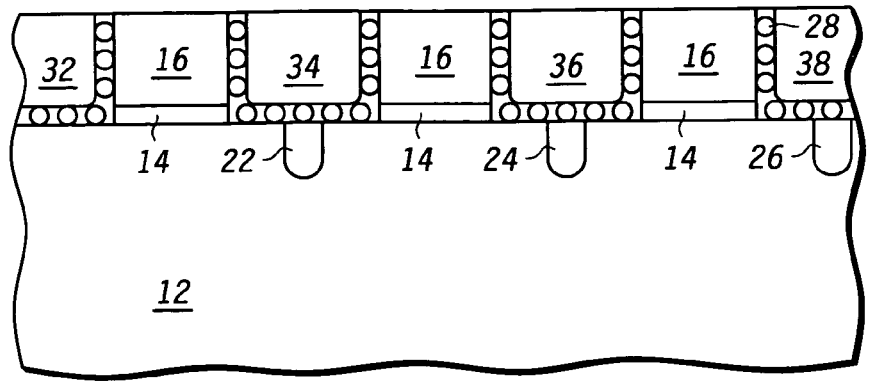
FIG. 7 is a cross section of the storage device structure of FIG. 6 at a subsequent stage in processing.

Shown in FIG. 7 is storage device structure 10 after a planarizing process that removes gate metal layer 30 from over patterned nitride layer 16. This leaves control gates 32, 34, 36, and 38 between formed from gate layer 30 between patterned nitride layer 16. Chemical mechanical polishing (CMP) using nitride as the etch stop is preferably used for the planarizing. Another etch back process may alternatively be used.

Figure 8:
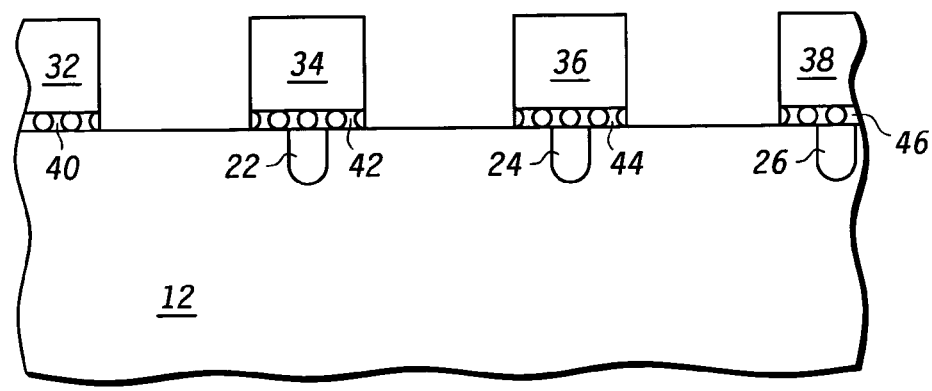
FIG. 8 is a cross section of the storage device structure of FIG. 7 at a subsequent stage in processing.

Shown in FIG. 8 is storage device structure 10 after removal of patterned nitride layers 16 and the remaining portions of oxide layer 14. This is achieved using a dry chlorine etch which is commonly used for etching nitride. This also removes oxide but is selective to silicon. This leaves control gates 32, 34, 36, and 38 and portions of substrate 12 exposed. Under control gates 32, 34, 36, and 38 are storage layers 40, 42, 44, and 46, respectively, formed from storage layer 28.

Figure 9:
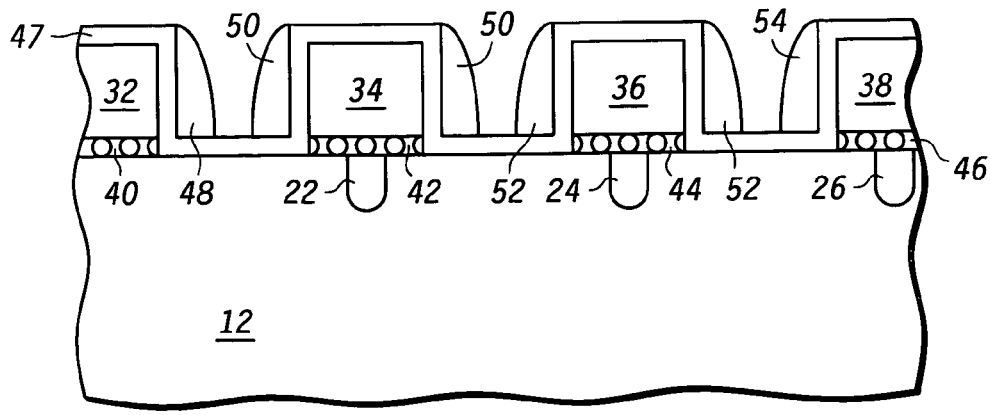
FIG. 9 is a cross section of the storage device structure of FIG. 8 at a subsequent stage in processing.

Shown in FIG. 9 is storage device structure 10 after forming a liner 47 on the exposed portions of substrate 12 and control gates 32, 34, 36, and 38 and also forming spacer 48 around control gate 32, spacer 50 around control gate 34, spacer 52 around control gate 36, and spacer 54 around control gate 38. Spacers 48, 50, 52, and 54 are preferably nitride but could another material.

Figure 10:
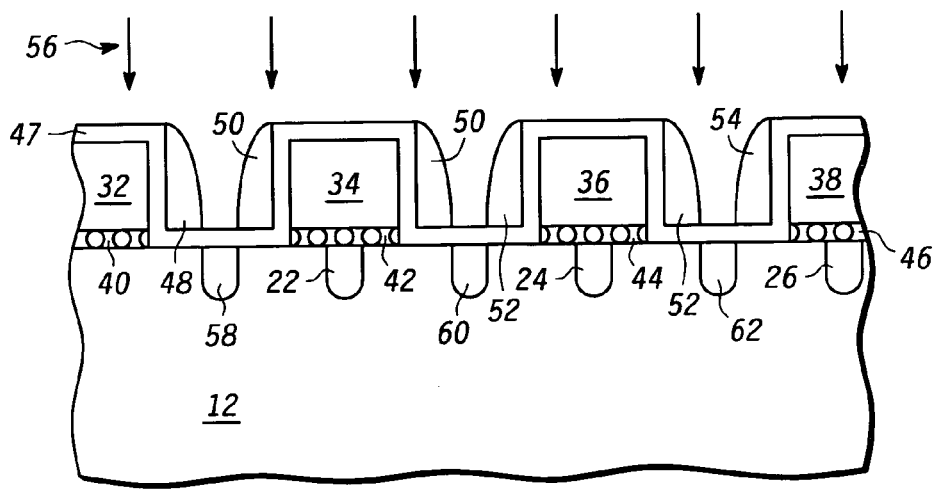
FIG. 10 is a cross section of the storage device structure of FIG. 9 at a subsequent stage in processing.

Shown in FIG. 10 is storage device structure 10 after an implant 56 forms doped regions 58, 60, and 62 between control gates 32, 24, 36, and 38 using sidewall spacers 48, 50, 52, and 54 as a mask. This implant is preferably the same as implant 20 shown in FIG. 3.

Figure 11:
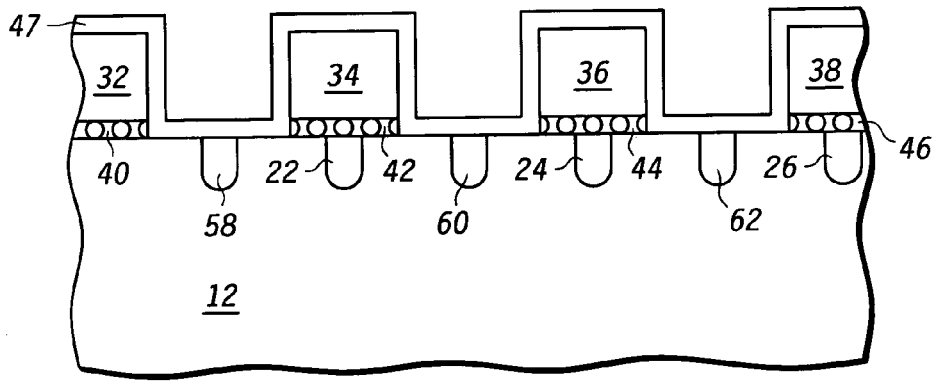
FIG. 11 is a cross section of the storage device structure of FIG. 10 at a subsequent stage in processing.

Shown in FIG. 11 is storage device structure 10 after removal of sidewall spacers 48, 50, 52, and 54. This is achieved preferably using a dry chlorine etch.

Figure 12:
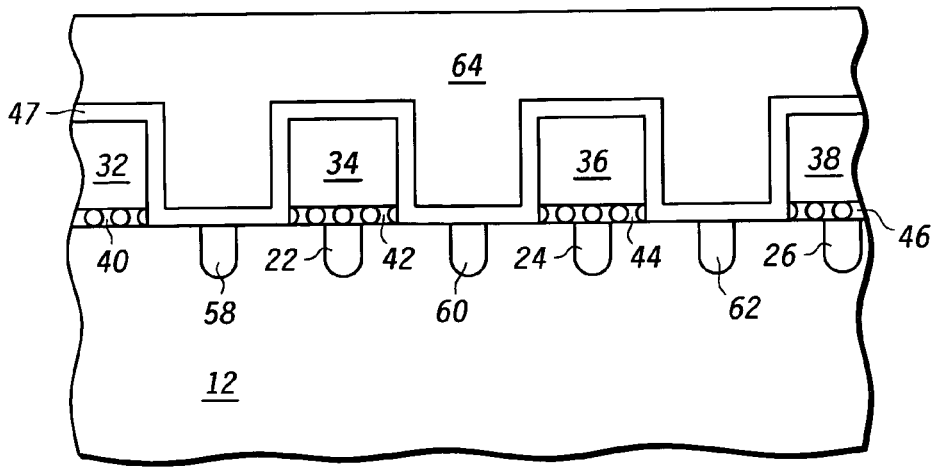
FIG. 12 is a cross section of the storage device structure of FIG. 11 at a subsequent stage in processing.

Shown in FIG. 12 is storage device structure 10 after formation of a select gate 64 which is preferably formed in the same manner as gate layer 30 of FIG. 6 but could be a different material and could be formed differently.

Figure 13:
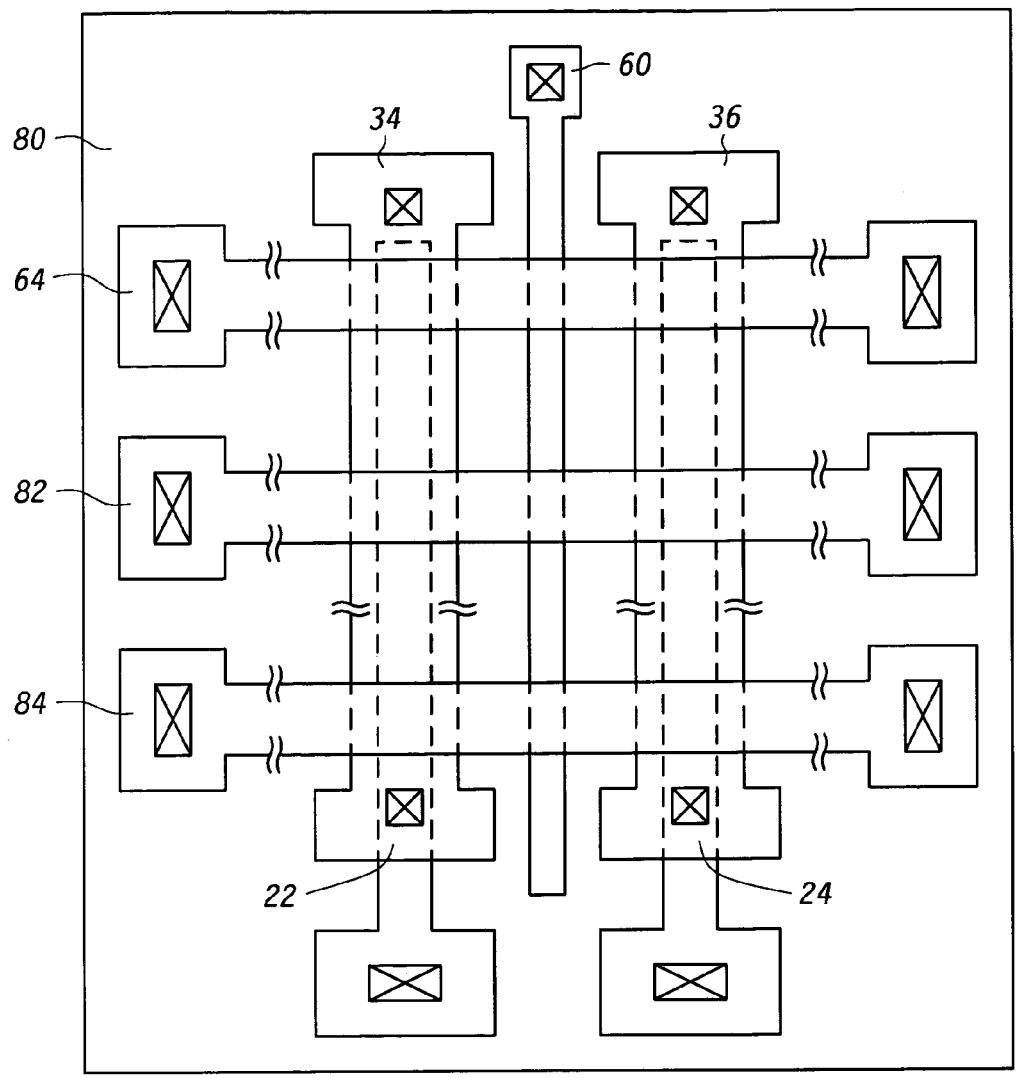
FIG. 13 is a top view of the storage device structure of FIGS. 1–12.

Shown in FIG. 13 is storage device structure 10 of FIG. 12 from a top view depicting a VGA type memory array 80 using the storage device structure of FIG. 12. Select gate 64 runs in what is commonly described as the row direction. Similarly control gates 34 and 36 run in the column direction as do doped regions 22, 24, and 60. Additional select gate structures 82 and 84 are also shown running parallel to select gate 64. An actual memory would of course have many more structures than those shown in FIG. 13. In this example, the doped regions 22 and 24 immediately under control gates 34 and 36. Doped region 60 between the control gates functions as sources.

In operation, a memory cell is defined as the structure between one doped region under a control gate and an adjacent doped region between control gates. Thus for example, one memory cell comprises doped region 22, doped region 60, and the portion of control gate 34 between doped regions 22 and 60, the portion of select gate 64 between doped regions 22 and 60. The channel is the portion of substrate 12 between doped regions 22 and 60 along the top surface of substrate 12. Oxide 47 functions as the gap dielectric where the electrons in the channel region gain energy for injection during programming where select gate 64 is closer to the channel than control gate 34. To program this memory cell, select gate 64 is biased to a voltage of about 2 to 3 volts, doped region 60, which functions as a source, is grounded, control gate 34 is biased to a voltage of about 5 to 6 volts, and doped region 22, which functions a drain, is biased to about 5 volts. This establishes a current flow through the channel. Electrons come from the source, doped region 60, and are injected into storage layer 42 at the edge of control gate 34 which is closest to the source. Thus, source side injection is achieved. This is continued until program layer 42 has captured sufficient electrons for providing enough bias to significantly impede current in the channel during a read operation. During a read, both select gate 64 and control gate 34 are biased sufficiently to cause measurable current flow through the channel in the absence of being programmed. In the programmed condition, the accumulation of electrons in storage layer 42 prevents the channel from inverting in that the region of the channel immediately under where the electrons accumulated. This impedes current between doped regions 60 and 22 so that the difference in current flow between being programmed and not programmed is significant and can be measured. Erase is performed by biasing control gate 34 to about minus 6 volts and substrate 12 to about plus 6 volts.

Similar operation is applied to the other memory cells shown in FIG. 12. The other memory cell that shares control gate 34 and doped region 22 has its channel between doped regions 58 and 22, which function as source and drain, respectively. Another memory cell shares doped region 60 and has its channel between doped regions 60 and 44, which function as source and drain respectively. Thus the benefit of saving chip area by sharing both the doped regions and the select gates between cells is combined with the benefits of SSI are both provided.

Figure 14:
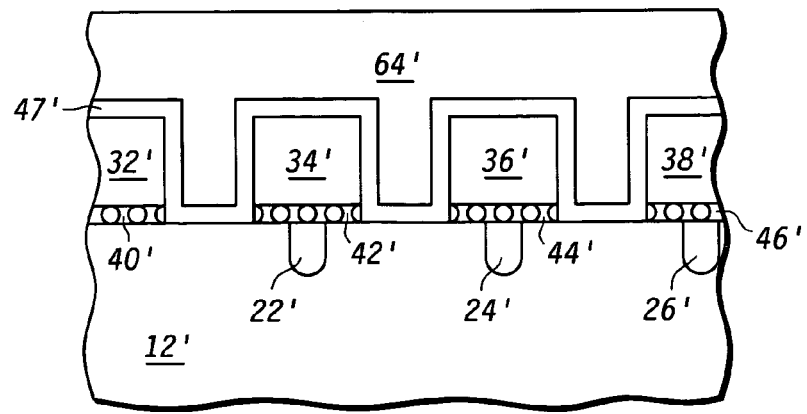
FIG. 14 is a cross section of a storage that is an alternative to that shown in FIGS. 1–13.

Shown in FIG. 14 is a storage device structure 10' similar to storage structure 10 of FIG. 12. In this example analogous features have the same numeral with but with an accent mark. Storage device structure 10' is made by using the same process but skipping the sidewall spacer formation of FIG. 9 and the processes of FIGS. 10 and 11. This can be viewed as going from FIG. 8 to FIG. 12 but with a liner analogous to liner 47 added. In this case, patterned nitride layers 16 would be about half as wide but maintaining the same spacing as that shown in FIG. 1. The result is that there is no doped region analogous to doped regions 58, 60, and 62 between the control gates so the space required is reduced.

In the case of storage device 10' of FIG. 14, a memory cell is the structure between adjacent doped regions and each memory cell is two bits that is achieved by changing the polarities of the doped regions. For example, one memory cell comprises doped regions 42' and 44', the portions of control gates 34' and 36' that is between doped regions 42' and 44', and the portion of select gate 64' between doped regions 22' and 24'. The channel is between doped regions 22' and 24' along the top surface of substrate 12. One bit is represented by the portion of storage layer 42 that is between doped regions 22' and 24' and a second bit is represented by the portion of storage layer 44 that is between doped regions 22' and 24'. Similarly, two more bits are represented by the structure between and including doped regions 24' and 26'.

As an example, for programming the bit at storage layer 42' between doped regions 22' and 24', doped region 22' functions as the drain and doped region 24' functions as the source. Control gate 36' is positively biased to invert the channel thereunder, select gate 64' is positively biased to invert the channel between control gates 34' and 36', control gate 34' is positively biased to attract electrons into storage layer 42', and doped region 22' is positively biased to induce channel current that generates hot carriers. Similarly for the bit represented at storage layer 44' that is between doped regions 22' and 24', programming is achieved by reversing the biases at doped regions 22' and 24' and at control gates 34' and 36' while keeping substrate 12 and select gate 64' the same.

Reading is achieved by using doped region 22' as the drain for reading the bits in storage layer 42' and using doped region 24' as the drain while reading the bits at storage layer 44'. Programming is achieved in the same way as for storage device 10 of FIG. 12.

Various changes and modifications to the embodiments herein chosen for purposes of illustration will readily occur to those skilled in the art. For example, these embodiments have been shown using a bulk silicon substrate but another substrate type, such as semiconductor on insulator (SOI) or SOI hybrid, could also be used. Also, hot carrier injection (HCI) can also be used in conjunction with SSI to cause programming at interior portions of the storage layers. Thus for example programming could be at both the left and right side of storage layer 42 close to doped region 22. By injecting electrons in the central area of storage layer 42 using HCI and injecting electrons at the lateral outside edge of storage layer 42 using SSI, two bits of information may be programmed on each side of storage layer 42. Literally then, storage layer 42 could actually store four bits. To the extent that such modifications and variations do not depart from the spirit of the invention, they are intended to be included within the scope thereof which is assessed only by a fair interpretation of the following claims.

The invention claimed is:

1. A method for forming a storage device structure comprising:
   providing a substrate of a first conductivity type;
   forming overlying regions of sacrificial material;
   forming a first doped region of a second conductivity type opposite the first conductivity type and a second doped region of the second conductivity type within the substrate and on opposite sides of one of the regions of sacrificial material;
   after the steps of forming the overlying regions and forming the first doped region, forming a discrete charge storage layer overlying the substrate and between the regions of the sacrificial material;
   forming a first conductive control electrode and a second conductive control electrode overlying the substrate and on opposite sides of the one of the regions of sacrificial material; and
   forming a conductive select electrode overlying and between both of the first conductive control electrode and the second conductive control electrode.

2. The method of claim 1 further comprising:
   forming a third doped region of the second conductivity type between the first doped region and the second doped region and between the first conductive control electrode and the second conductive control electrode.

3. The method of claim 2 further comprising:
   forming the conductive select electrode also over the third doped region.

4. The method of claim 1 further comprising:
   forming disposable sidewall spacers adjacent the overlying regions prior to forming the first doped region and the second doped region; and
   removing the disposable sidewall spacers after forming the first doped region and the second doped region.

5. The method of claim 1 further comprising:
   using nanoclusters to form the discrete charge storage layer.

6. The method of claim 1 further comprising:
   using nitride as the sacrificial material.

7. The method of claim 1 wherein forming the discrete charge storage layer overlying the substrate between the sacrificial material further comprises depositing a layer of nanoclusters and removing portions of the layer that are not underlying the first conductive control electrode and the second conductive control electrode.

8. A method for forming a storage device structure comprising
   providing a substrate;
   forming a plurality of regions of sacrificial material overlying the substrate;
   forming a disposable sidewall spacer on each of the regions of sacrificial material to decrease distance separating the regions of sacrificial material;
   forming a plurality of diffusions in portions of the substrate that are not covered by either a disposable sidewall spacer or the regions of sacrificial material;
   removing the disposable sidewall spacer on each of the regions of sacrificial material;
   depositing a discrete charge storage layer and patterning the discrete storage layer to form a plurality of discrete charge storage materials that overlie each of the plurality of diffusions;
   forming a plurality of control gates, each of the plurality of control gates overlying one of the plurality of discrete charge storage materials;
   forming a gate dielectric layer in contact with a portion of the plurality of control gates; and
   forming a select gate overlying each of the plurality of control gates and laterally between each of the plurality of control gates, wherein adjacent memory cells share the select gate.

9. The method of claim 8 further comprising:
   forming another plurality of diffusions in the substrate, between the regions of sacrificial material and underlying the select gate, each of the another plurality of diffusions functioning as current electrode.

10. The method of claim 8 further comprising:
    biasing the storage device structure to permit each of the plurality of diffusions to function as a source for a first of two storage bits in a single memory cell and as a drain for a second of the two storage bits.

11. The method of claim 8 further comprising:
    forming removable sidewall spacers around each of the plurality of control gates prior to forming the another plurality of diffusions in the substrate, the removable sidewall spacers substantially centering the another plurality of diffusions in the substrate between the plurality of control gates; and
    removing the removable sidewall spacers.

* * * * *